US011829539B1

(12) United States Patent
Liu et al.

(10) Patent No.: US 11,829,539 B1
(45) Date of Patent: Nov. 28, 2023

(54) TOUCH SENSOR AND MANUFACTURING METHOD THEREOF

(71) Applicant: TPK Advanced Solutions Inc., Fujian (CN)

(72) Inventors: Shao Jie Liu, Xiamen (CN); Chia Jui Lin, Taoyuan County (TW); Chien Hsien Yu, Hsinchu County (TW); Jian Zhang, Xiamen (CN); Si Qiang Xu, Xiamen (CN); Jun Hua Huang, Fujian Province (CN); Mei Fen Bai, Quanzhou (CN); Song Xin Wang, Xiamen (CN); Long Yun Zhan, Jilin (CN); Bo Huang, Jilin (CN)

(73) Assignee: TPK ADVANCED SOLUTIONS INC., Fujian (CN)

( * ) Notice: Subject to any disclaimer, the term of this patent is extended or adjusted under 35 U.S.C. 154(b) by 0 days.

(21) Appl. No.: 17/745,233

(22) Filed: May 16, 2022

(51) Int. Cl.
| | |
|---|---|
| *G06F 3/041* | (2006.01) |
| *G03F 7/16* | (2006.01) |
| *G03F 7/42* | (2006.01) |
| *G03F 7/30* | (2006.01) |

(52) U.S. Cl.
CPC ............ *G06F 3/041* (2013.01); *G03F 7/16* (2013.01); *G03F 7/30* (2013.01); *G03F 7/427* (2013.01); *G06F 2203/04103* (2013.01)

(58) Field of Classification Search
CPC .. G06F 3/041; G06F 2203/04103; G03F 7/16; G03F 7/30; G03F 7/427
See application file for complete search history.

(56) References Cited

U.S. PATENT DOCUMENTS

| | | | |
|---|---|---|---|
| 2018/0196561 A1* | 7/2018 | Kim | G06F 3/0412 |
| 2020/0012372 A1* | 1/2020 | Chang | G03F 7/16 |
| 2021/0301403 A1* | 9/2021 | Routh | B31F 1/07 |

FOREIGN PATENT DOCUMENTS

| | | |
|---|---|---|
| TW | 201610772 A | 3/2016 |
| TW | M563005 U | 7/2018 |
| TW | I662563 B | 6/2019 |
| TW | I663534 B | 6/2019 |
| TW | M604962 U | 12/2020 |
| TW | M607393 U | 2/2021 |
| TW | I726741 B | 5/2021 |
| TW | I727687 B | 5/2021 |
| TW | I733506 B | 7/2021 |
| TW | I749832 B | 12/2021 |

\* cited by examiner

*Primary Examiner* — Sahlu Okebato
(74) *Attorney, Agent, or Firm* — Cooper Legal Group, LLC (57) ABSTRACT

A touch sensor having a visible area and a peripheral area includes a substrate, a metal nanowire layer, and a silver layer. The metal nanowire layer is disposed on a main surface of the substrate and defines an electrode portion and first and second wirings, in which the first wiring includes a lead-out portion connected to the electrode portion and a lead portion connected to the lead-out portion, and the second wiring is disposed on a side of the first wiring relatively away from the visible area and adjacent to an edge of the main surface. The silver layer is stacked on the first and second wirings and has a first side facing toward the visible area and a second side facing away from the visible area, and an edge roughness on the first side is greater than an edge roughness on the second side.

18 Claims, 8 Drawing Sheets

TOUCH SENSOR AND MANUFACTURING METHOD THEREOF

BACKGROUND

FIELD OF DISCLOSURE

The present disclosure relates to a touch sensor and a manufacturing method of a touch sensor.

DESCRIPTION OF RELATED ART

In recent years, touch sensors have been widely used in portable electronic products such as mobile phones, notebook computers, satellite navigation systems, and digital audio-visual players to serve as information communication channels between users and electronic devices.

As demand for narrow bezel electronic products gradually increases, the industry is committed to improving the bendability of the electronic products and reducing the size of the bezel of electronic products to meet the needs of users. Generally, a touch sensor includes touch electrodes located in the visible area and peripheral circuits located in the peripheral area, and based on the bending requirements of the touch panel, silver paste is currently preferably used as the material for the peripheral circuits. For the silver paste material, it is common to form a silver layer from the silver paste material by performing a screen-printing process, and to form the peripheral circuits with patterns in the peripheral area by patterning the silver layer. Also, the peripheral circuits designed in the peripheral area will affect the application of the touch panel to narrow-bezel products. Therefore, based on the use of silver paste as the material of the peripheral circuits, how to provide a touch sensor which can meet the requirements of flexibility as well as the requirements of narrow bezel design is currently worth studying.

SUMMARY

According to some embodiments of the present disclosure, a touch sensor having a visible area and a peripheral area adjacent to at least one side of the visible area includes a substrate, a metal nanowire layer, and a silver layer. The metal nanowire layer is disposed on a main surface of the substrate and defines an electrode portion corresponding to the visible area and defines a first wiring and a second wiring corresponding to the peripheral area. The second wiring is spaced apart from the first wiring, the first wiring includes a lead-out portion and a lead portion, the lead-out portion is adjacent and connected to the electrode portion, the lead portion is connected to the lead-out portion, and the second wiring is disposed on a side of the first wiring relatively far away from the visible area and adjacent to an edge of the main surface. The silver layer is stacked on and in contact with the first wiring and the second wiring. The silver layer has a first side facing toward the visible area on the lead-out portion and a second side facing away from the visible area on the second wiring, in which an edge roughness on the first side of the silver layer is greater than an edge roughness on the second side of the silver layer.

In some embodiments of the present disclosure, a width of the edge roughness on the first side of the silver layer is greater than or equal to 10 µm and less than or equal to 50 µm, and a width of the edge roughness on the second side of the silver layer is greater than or equal to 0.01 µm and less than or equal to 5 µm.

In some embodiments of the present disclosure, the metal nanowire layer defines a plurality of the first wirings disposed at intervals corresponding to the peripheral area, and the silver layer is disposed on and in contact with an upper surface of the first wirings to form a plurality of peripheral traces of the touch sensor.

In some embodiments of the present disclosure, a line width of the peripheral traces is greater than or equal to 6 µm and less than or equal to 10 µm, and a line spacing of any adjacent two peripheral traces of the peripheral traces is greater than or equal to 6 µm and less than or equal to 10 µm.

In some embodiments of the present disclosure, the silver layer has a third side facing away from the visible area on the lead-out portion and two fourth sides interconnecting the first side and the third side, and the lead-out portion, the third side of the silver layer, and the two fourth sides of the silver layer have sidewalls that are aligned.

In some embodiments of the present disclosure, the lead portion and the silver layer stacked on and in contact with the lead portion have sidewalls that are aligned.

In some embodiments of the present disclosure, the silver layer has a fifth side facing toward the visible area on the second wiring, and the second wiring and the fifth side of the silver layer have sidewalls that are aligned.

According to some other embodiments of the present disclosure, a manufacturing method of a touch sensor having a visible area and a peripheral area adjacent to at least one side of the visible area includes: forming a metal nanowire material layer on a main surface of a substrate, in which the metal nanowire material layer corresponds to the visible area and the peripheral area; performing a screen-printing process, such that a silver material layer is formed on the metal nanowire material layer and corresponds to the peripheral area; forming a photoresist layer to cover the metal nanowire material layer and the silver material layer; performing an exposure and development process to pattern the photoresist layer, in which the photoresist layer, which is patterned, defines an electrode portion pattern corresponding to the visible area and defines a first wiring pattern and a second wiring pattern corresponding to the peripheral area, the second wiring pattern is spaced apart from the first wiring pattern, the first wiring pattern comprises a lead-out portion pattern and a lead portion pattern, the lead-out portion pattern is adjacent and connected to the electrode portion pattern, the lead portion pattern is connected to the lead-out portion pattern, the second wiring pattern is disposed on a side of the first wiring pattern relatively far away from the visible area and adjacent to an edge of the main surface, and the electrode portion pattern and the lead-out portion pattern of the photoresist layer, which is patterned, is a continuously covering layer; performing a first etching process to pattern the silver material layer through the first wiring pattern and the second wiring pattern; performing a second etching process to pattern the metal nanowire material layer through the first wiring pattern and the second wiring pattern; and removing the photoresist layer.

In some embodiments of the present disclosure, the manufacturing method of the touch sensor further includes: performing a plasma treatment process after the first etching process and before the second etching process, such that the patterned silver material layer is processed through the first wiring pattern and the second wiring pattern.

In some embodiments of the present disclosure, the manufacturing method of the touch sensor further includes: performing a chemical cleaning process after the first etching process and before the plasma treatment process, such that the patterned silver material layer is pre-processed through the first wiring pattern and the second wiring pattern.

According to the aforementioned embodiments of the present disclosure, the touch sensor of the present disclosure is designed to include the metal nanowire layer which includes the electrode portion, the first wiring, and the second wiring as well as the silver layer stacked on and in contact with the first wiring and the second wiring. Since the size (e.g., the width) of the edge roughness on the side of the silver layer disposed on the second wiring and being far away from the visible area is smaller than the size of the edge roughness on the side of the silver layer disposed on the first wiring and facing toward the visible area, the outermost peripheral trace (e.g., the ground line) of the touch sensor can be provided with a smoother edge (i.e., a negligible edge roughness), which is beneficial to meet the narrow bezel requirement of the touch sensor. In addition, by integrally forming the electrode portion and the first wiring to directly form an electrical connection between the touch electrode and the peripheral trace, there is no need to design an additional overlapping structure for the touch sensor. Hence, an area occupied by the overlapping structure corresponding to the peripheral area can be saved, and the overlapping tolerance will not be generated, which is beneficial to realize the narrow bezel design of the touch sensor. Furthermore, based on the stacked-structure design of the touch sensor of the present disclosure, during the manufacturing process of the touch sensor, the patterned photoresist layer is designed to be continuously extending between its electrode portion pattern and its lead-out portion pattern, such that the touch electrode and the peripheral trace can be formed at once through a single exposure and development process (i.e., only a single photoresist layer is used), thereby reducing the steps and costs of the manufacturing process.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. However, it should be understood that these details should not be intend to limit the present disclosure. In addition, for the convenience of readers, the size of each element in the drawings is not illustrated according to actual scale. It should be understood that relative terms such as "lower" or "bottom" and "upper" or "top" can be used herein to describe the relationship between one element and another element, as shown in the figures. It should be understood that relative terms are intended to include different orientations of the device other than those shown in the figures.

Figure 1A:
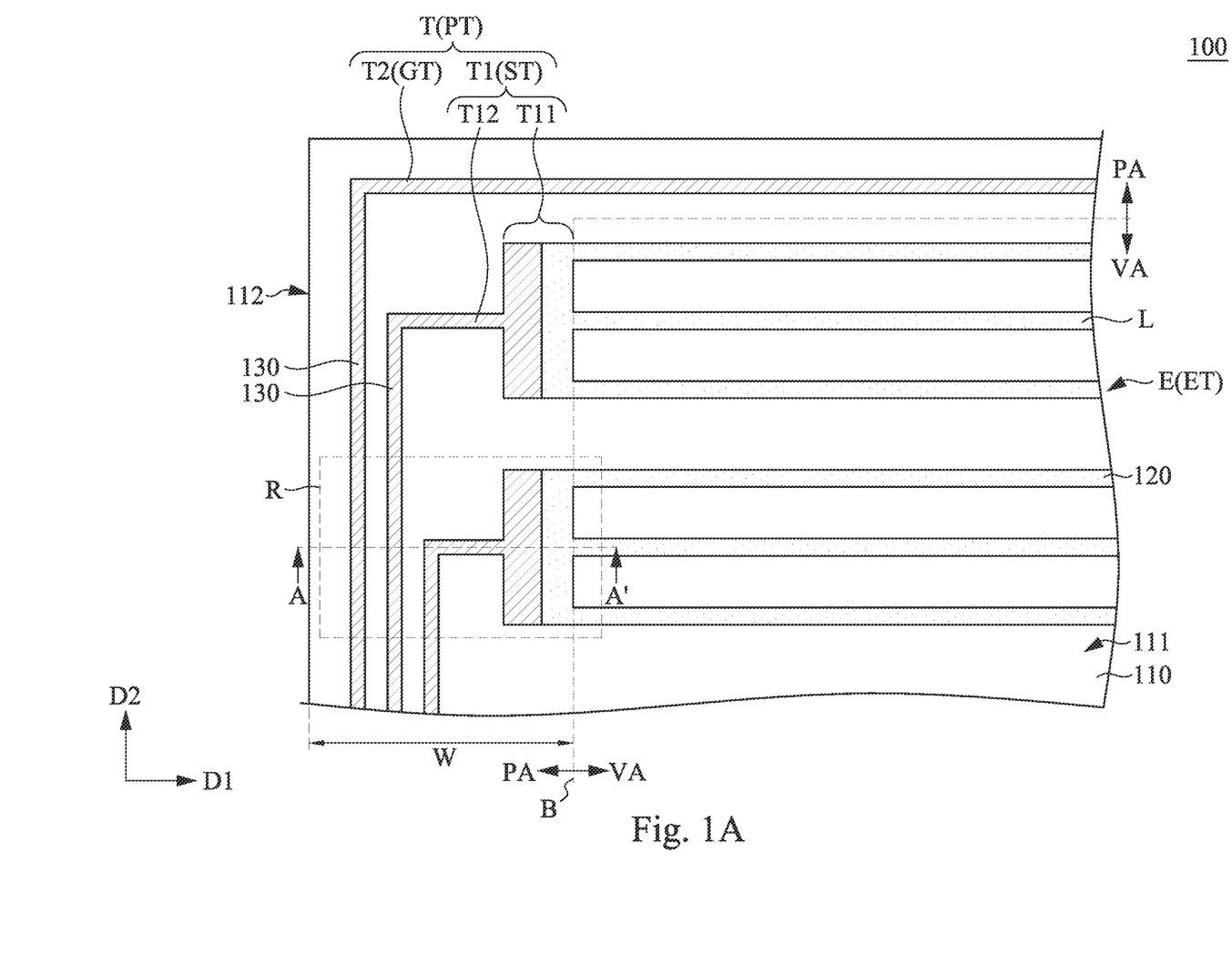
FIG. 1A is a schematic partial top view illustrating a touch sensor according to some embodiments of the present disclosure.
Figure 1B:
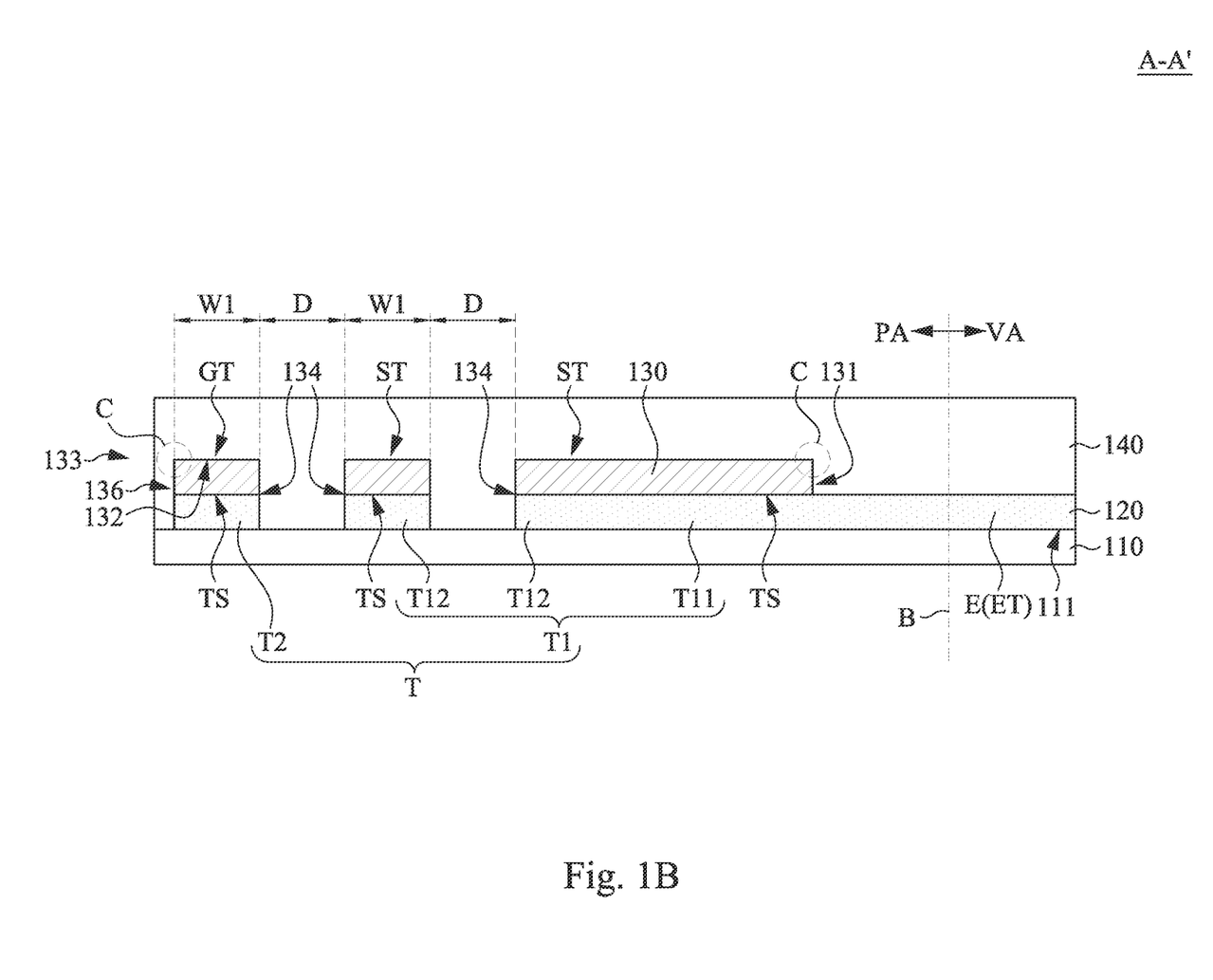
FIG. 1B is a schematic cross-sectional view illustrating the touch sensor in FIG. 1A taken along the line A-A'.

Reference is made to FIG. 1A and FIG. 1B, in which FIG. 1A is a schematic partial top view illustrating a touch sensor 100 according to some embodiments of the present disclosure, and FIG. 1B is a schematic cross-sectional view illustrating the touch sensor in FIG. 1A taken along the line A-A'. The touch sensor 100 includes a substrate 110, a metal nanowire layer 120, and a silver layer 130. In some embodiments, the touch sensor 100 has a visible area VA and a peripheral area PA, and the peripheral area PA is disposed on the sides of the visible area VA. For example, the peripheral area PA may be an L-shaped area disposed on the left and lower sides of the visible area VA. As another example, the peripheral area PA may be a frame-shaped area disposed around (i.e., including the right, left, upper, and lower sides of) the visible area VA. The substrate 110 has a main surface 111 configured to carry the metal nanowire layer 120 and the silver layer 130, and the substrate 110 may be, for example, a rigid transparent substrate or a flexible transparent substrate. In some embodiments, a material of the substrate 110 may include, but is not limited to, transparent materials such as glass, acrylic, polyvinyl chloride, cycloolefin polymer, cycloolefin copolymer, polypropylene, polystyrene, polycarbonate, polyethylene terephthalate, polyethylene naphthalate, colorless polyimide, or combinations thereof.

The metal nanowire layer 120 is disposed on the main surface 111 of the substrate 110 and corresponds to the visible area VA and the peripheral area PA. In some embodiments, the metal nanowire layer 120 may include a matrix and a plurality of metal nanowires (not shown) distributed in the matrix, in which the matrix may include an acrylic material such as poly (methyl methacrylate), and the metal nanowires may include silver nanowires, gold nanowires, copper nanowires, nickel nanowires, or combinations thereof. The metal nanowire layer 120 defines an electrode portion E corresponding to the visible area VA, and the electrode portion E is configured to realize the touch function. That is, the electrode portion E can at least constitute a touch electrode ET of the touch sensor 100. In some embodiments, the electrode part E may be a single-sided single-layer, double-sided single-layer, or single-sided double-layer structure disposed on the substrate 110. In the embodiment shown in FIG. 1A, the electrode portion E is an example of a single-layer electrode structure disposed on a single surface (side) of the substrate 110, in which a plurality of the electrode portions E are arranged in a non-interlaced manner. For example, the electrode portions E may be strip-shaped electrodes extending along a first direction D1 and arranged at intervals along a second direction D2, in which the first direction D1 is perpendicular to the second direction D2. In some embodiments, each electrode portion E may include a plurality of electrode lines L arranged and connected in parallel. For example, in the embodiment shown in FIG. 1A, each electrode portion E includes three electrode lines L arranged and connected in parallel.

The metal nanowire layer 120 defines a wiring portion T corresponding to the peripheral area PA, in which the wiring portion T includes a first wiring T1 and a second wiring T2 arranged at intervals, and the second wiring T2 is disposed on a side of the first wiring T1 relatively far away from the visible area VA and adjacent and parallel to an edge 112 of the main surface 111 of the substrate 110. The first wiring T1 includes a lead-out portion T11 and a lead portion T12, in which the lead-out portion T11 is adjacent and connected to the electrode portion E, and the lead portion T12 is connected to the lead-out portion T11. In other words, the electrode portion E, the lead-out portion T11, and the lead portion T12 sequentially extend from the visible area VA to the peripheral area PA to form a signal transmission path across the visible area VA and the peripheral area PA. In some embodiments, the lead-out portion T11 may be a component configured to connect a plurality of the electrode lines L of the electrode portion E in parallel, and the region occupied by the lead-out portion T11 can provide a certain area for the silver layer 130 to form stable electrical contact with the metal nanowire layer 120. In this embodiment, for the first wiring T1 and the second wiring T2 that are disposed on the same side of the visible area VA, the second wiring T2 is parallel to a boundary B between the visible area VA and the peripheral area PA and is spaced apart from and parallel to the lead portion T12 of the first wiring T1 that extends along an extending direction of the boundary (e.g., the second direction D2).

The silver layer 130 is disposed on the main surface 111 of the substrate 110 and stacked on and in contact with the first wiring T1 and the second wiring T2. More specifically, in this embodiment, the first wiring T1 of the present disclosure can be configured to form a signal line ST of the touch sensor 100 for transmitting the touch signal to, for example, an external electronic component. Therefore, the number of the first wiring T1 is usually designed to be multiple in order to correspond to the number of the electrode portion E. On the other hand, the second wiring T2 can be configured to, for example, form a ground line GT of the touch sensor 100 to prevent electrostatic/electromagnetic wave interference. In addition, in some embodiments, the peripheral area PA is a frame-shaped area disposed around the visible area VA, and the second wiring T2 is disposed along the four sides of the main surface 111 of the substrate 110 to surround the entire visible area VA and the first wiring T1. In some other embodiments, if there is no need for the design of the ground line GT, the second wiring T2 can be configured to form a signal line ST that is the farthest from the visible area VA among all of the signal lines ST. Therefore, no matter what function the second wiring T2 is defined for providing, the silver layer 130 of the present disclosure is stacked on and in contact with an upper surface TS of the first wiring T1 and the second wiring T2 to form a plurality of peripheral traces PT of the touch sensor 100. In other words, the peripheral trace PT of the present disclosure has a double-layer structure, in which the metal nanowire layer 120 is disposed relatively close to the substrate 110, and the silver layer 130 is stacked on a surface of the metal nanowire layer 120 that faces away from the substrate 110.

Furthermore, the silver layer 130 in this embodiment may at least partially overlap the lead-out portion T11 of the first wiring T1 and completely overlap the lead portion T12 of the first wiring T1 and the second wiring T2. That is, a vertical projection of the silver layer 130 stacked on and in contact with the lead-out portion T11 on the substrate 110 may at least overlap a portion of a vertical projection of the lead-out portion T11 on the substrate 110, and a vertical projection of the silver layer 130 stacked on and in contact with the lead portion T12 and the second wiring T2 on the substrate 110 may completely overlap a vertical projection of the lead portion T12 and the second wiring T2 on the substrate 110. Based on the above configuration of the metal nanowire layer 120 and the silver layer 130, an electrical connection between the touch electrode ET and the peripheral trace PT can be directly formed by integrally forming the electrode portion E and the first wiring T1, which both belong to the metal nanowire layer 120. Hence, there is no need for the design of an additional overlapping structure for realizing the electrical contact between the touch electrode ET and the peripheral trace PT, such that an area occupied by the overlapping structure corresponding to the peripheral area PA can be saved, and the overlapping tolerance will not be generated, which is beneficial to meet the narrow bezel requirement of the touch sensor 100.

As a supplementary note, since the peripheral traces PT are designed to be insulated from each other and arranged at intervals, the silver layer 130 of the present disclosure is only disposed on the upper surface TS of the first wiring T1 and the second wiring T2 to overlap the first wiring T1 and the second wiring T2, thereby ensuring that the silver layer 130 and the first wiring T1/second wiring T2 have sidewalls 134 that are aligned. In other words, when the silver layer 130 is stacked on the first wiring T1 and the second wiring T2, the silver layer 130 will not cover the sidewalls of the first wiring T1 and the second wiring T2, so as to prevent the line width of the peripheral trace PT from increasing. When viewing from another perspective (e.g., from top or from side), the silver layer 130 and the first wiring T1/second wiring T2 have substantially the same pattern.

Figure 1C:
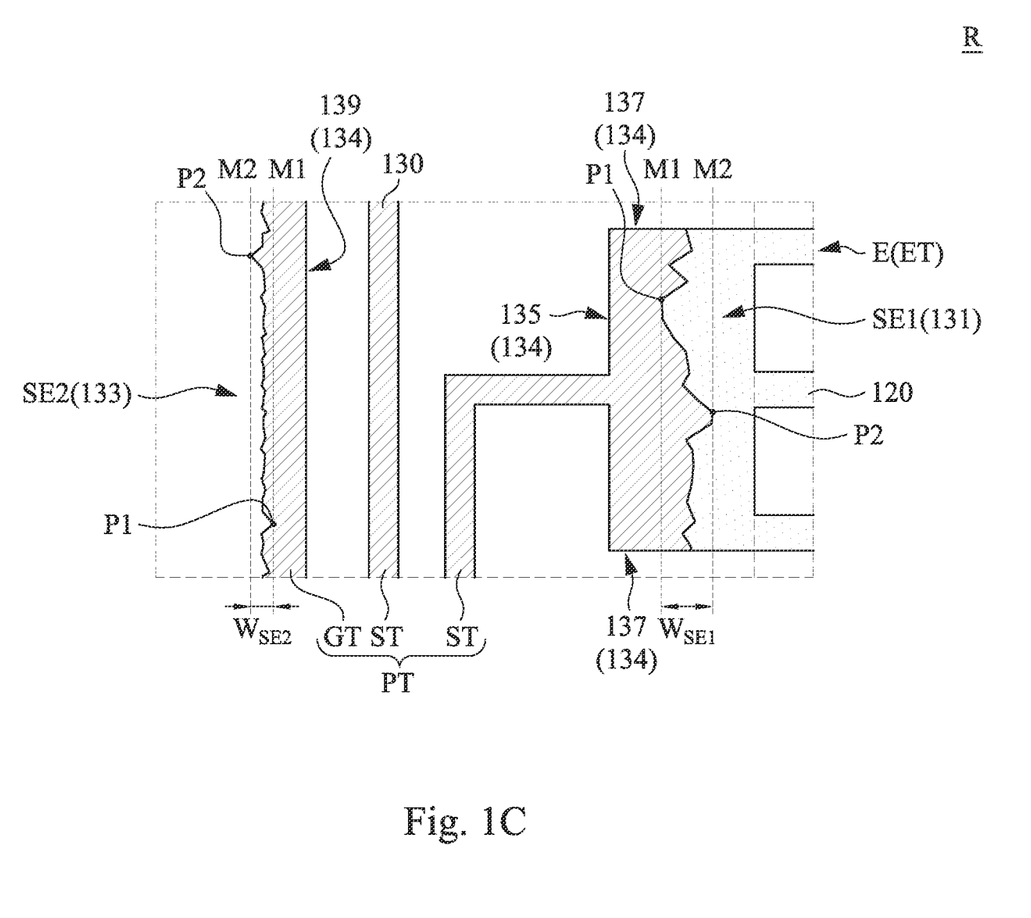
FIG. 1C is a schematic partial enlargement view illustrating the region R of the touch sensor in FIG. 1A.

FIG. 1C is a schematic partial enlargement view illustrating the region R of the touch sensor 100 in FIG. 1A. Reference is made to FIG. 1B and FIG. 1C. The silver layer 130 is stacked on and in contact with the first wiring T1 and the second wiring T2, in which the silver layer 130 has a first side 131 and a second side 133, the first side 131 faces toward the visible area VA and is disposed on the lead-out portion T11 of the first wiring T1, and the second side 133 faces away from the visible area VA and is disposed on the second wiring T2. Due to the one mask etching process performed in the present disclosure for manufacturing the touch sensor 100 (for more details, please refer to the following paragraphs), the silver layer 130 can be provided with a specific feature. In detail, the first side 131 of the silver layer 130 has an edge roughness SE1 which continuously extends, and the second side 133 of the silver layer 130 also has an edge roughness SE2 which continuously extends, in which the size (e.g., width $W_{SE1}$) of the edge roughness SE1 on the first side 131 of the silver layer 130 is larger than the size (e.g., width $W_{SE2}$) of the edge roughness SE2 on the second side 133 of the silver layer 130. In addition, it is worth noting that the term "edge roughness" mentioned in the present disclosure can also be referred to as the term "saw edge", which means that an edge is uneven and undulating. That is, the edge roughness may include any number of concave portions and convex portions, and the contour shapes of each concave portion and each convex portion are not intended to limit the present disclosure, and that the contour shapes of each concave portion and each convex portion may be regular or irregular. Although the term "edge roughness" may also be referred to as the term "saw edge", the edge roughness does not necessarily have a sharp shape similar to a sawtooth. It is worth noting that when viewed from a side of the touch sensor 100 (i.e., viewing from the perspective of FIG. 1B), the specific positions of the edge roughness SE1 and SE2 are located at a turning point C between an upper surface 132 and an outer sidewall 136 of the silver layer 130.

Figure 2:
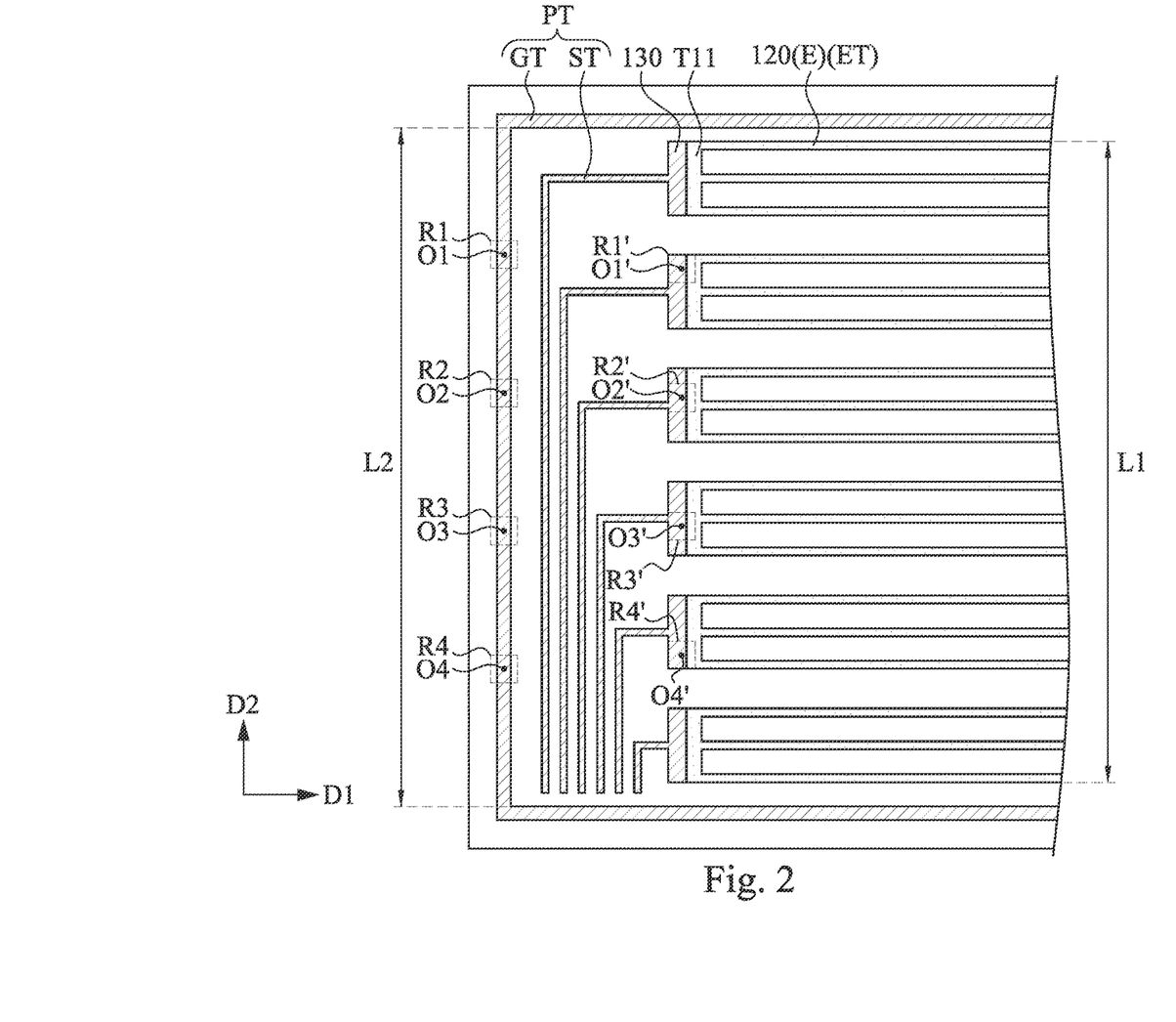
FIG. 2 is a schematic view illustrating a measurement method of a width of an edge roughness according to some embodiments of the present disclosure.

A method for measuring the width $W_{SE2}$ of the edge roughness SE2 on the second side 133 of the silver layer 130 is further supplemented. Reference is made to FIG. 10 and FIG. 2, in which FIG. 2 is a schematic view illustrating a measurement method of a width of an edge roughness according to some embodiments of the present disclosure. A rectangular touch sensor 100 is illustrated in FIG. 2 as an example, and the electrode portion E of the touch sensor 100 in FIG. 2 are strip-shaped electrodes extending along the first direction D1 and arranged at intervals along the second direction D2. The width $W_{SE2}$ of the edge roughness SE2 on the second side 133 of the silver layer 130 can be obtained by performing a specific measurement on the silver layer 130 of the ground line GT, and the measurement method may include the following steps. Step S1: Divide an extension length L2 of the ground line GT into five sections with equal length by four points O1-O4, in which the ground line GT is disposed on one side of the touch sensor 100 and extends along the second direction D2. Step S2: Take point O1 as a center point of the observation range R1 (the observation range R1 is of 10 times the objective lens and 10 times the eyepiece) of an Olympus optical microscope, then adjust a first measuring line M1 which extends along the second direction D2 to touch the most concave point P1 of the most concave portion of the edge roughness SE2, and then adjust a second measuring line M2 which also extends along the second direction D2 to touch the most convex point P2 of the most convex portion of the edge roughness SE2 (please refer to FIG. 10 for clear understanding). Step S3: Measure a vertical distance between the first measurement line M1 and the second measurement line M2 to obtain the width of the edge roughness SE2 in the observation range R1. Step S4: Respectively take points O2-O4 as center points of the observation ranges R2-R4 (the observation range ranges R2-R4 are of 10 times the objective lens and 10 times the eyepiece) of the same Olympus optical microscope, and repeat steps S2-S3 to respectively obtain the widths of the edge roughness SE2 in the observation ranges R2-R4. Step S5: Calculate the average value of the widths of the edge roughness SE2 in the observation ranges R1-R4 (4 numbers in total) obtained in the previous steps, and take average value as the width $W_{SE2}$ of the edge roughness SE2 on the second side 133 of the silver layer 130. After steps S1 to S5 are performed, the width $W_{SE2}$ of the edge roughness SE2 on the second side 133 of the silver layer 130 can be obtained. It should be understood that in FIG. 10, although the vertical distance between the first measurement line M1 and the second measurement line M2 in the observation range R1 is directly marked as the width $W_{SE2}$ of the edge roughness SE2, the width $W_{SE2}$ of the edge roughness SE2 is in fact the average value of the widths of the edge roughness SE2 obtained in the observation ranges R1-R4.

A method for measuring the width $W_{SE1}$ of the edge roughness SE1 on the first side 131 of the silver layer 130 is further supplemented. Reference is also made to FIG. 10 and FIG. 2. The measurement method of the width $W_{SE1}$ of the edge roughness SE1 on the first side 131 of the silver layer 130 may include the following steps. Step S1': Divide a total length L1 of all of the electrode portions E arranged at intervals along the second direction D2 into sections with equal length by four points O1'-O4', in which the total length L1 extends along the second direction D2. Step S2': Take point O1' as a center point of the observation range R1' (the observation range R1' is of 10 times the objective lens and 10 times the eyepiece) of the Olympus optical microscope, and then perform the aforementioned step S2 on the edge roughness SE1. Step S3': Perform the aforementioned step S3, of which the details will not be repeated hereinafter. Step S4': Respectively take points 02'-04' as center points of the observation ranges R2'-R4' (the observation ranges R2'-R4' are of 10 times the objective lens and 10 times the eyepiece) of the same Olympus optical microscope, and then perform the aforementioned step S4 on the edge roughness SE1. Step S5': Calculate an average value of the widths of the edge roughness SE1 in the observation ranges R1'-R4' (4 numbers in total) obtained in the previous steps, and take the average value as the width $W_{SE1}$ of the edge roughness SE1 on the first side 131 of the silver layer 130. After steps S1' to S5' are performed, the width $W_{SE1}$ of the edge roughness SE1 on the first side 131 of the silver layer 130 can be obtained. It should be understood that in FIG. 10, although the vertical distance between the first measurement line M1 and the second measurement line M2 in the observation range R1' is directly marked as the width $W_{SE1}$ of the edge roughness SE1, the width $W_{SE1}$ of the edge roughness SE1 is in fact the average value of the widths of the edge roughness SE1 obtained in the observation ranges R1'-R4'.

Reference is made to FIG. 1B and FIG. 10. In some embodiments, the width $W_{SE1}$ of the edge roughness SE1 on the first side 131 of the silver layer 130 may be greater than or equal to 10 μm and less than or equal to 50 μm, and the width $W_{SE2}$ of the edge roughness SE2 on the second side 133 of the silver layer 130 may be greater than or equal to 0.01 μm and less than or equal to 5 μm. Since the one mask etching process is performed in the present disclosure, the first side 131 of the silver layer 130 disposed on the lead-out portion T11 of the first wiring T1 should be controlled not to be etched, so as to prevent the lead-out portion T11 below the silver layer 130 from being etched simultaneously, thus preventing the electrical connection between the electrode portion E and the lead portion T12 from being cut off. Therefore, the edge roughness SE1 generated by the screen-printing process of the silver layer 130 is left on the first side 131 of the silver layer 130. In other words, except for the first side 131 of the silver layer 130, the other sides of the silver layer 130 on the first wiring T1 and the second wiring T2 can be etched to be trimmed, and the silver layer 130, the first wiring T1, and the second wiring T2 can have sidewalls that are aligned. Hence, sides including the second side 133 of the silver layer 130 have relatively small edge roughness. Specifically, for the first wiring T1 and the silver layer 130 disposed on the first wiring T1, the silver layer 130 has a third side 135 on the lead-out portion T11 relatively far away from the visible area VA (compared to the first side 131) and two fourth sides 137 interconnecting the first side 131 and the third side 135, in which the lead-out portion T11, the third side 135 of the silver layer 130, and the two fourth sides 137 of the silver layer 130 have sidewalls 134 that are aligned, and the lead portion T12 and the silver layer 130 stacked on and in contact with the lead portion T12 also have sidewalls 134 that are aligned; for the second wiring T2 and the silver layer 130 disposed on the second wiring T2, the silver layer 130 has a fifth side 139 on the second wiring T2 relatively facing toward the visible area VA (compared to the second side 133), and the second wiring T2 and the fifth side 139 of the silver layer 130 have sidewalls 134 that are aligned. It is worth noting that, in the present disclosure, the material layer for forming the metal nanowire layer 120 is firstly formed corresponding to an entire surface of the peripheral area PA, then the material layer for forming the silver layer 130 is formed corresponding to an entire surface of the peripheral area PA, and then the one mask etching process is performed to pattern the above-mentioned material layers to further form the peripheral trace PT. Therefore, the lead-out portion T11, the third side 135 of the silver layer 130, and the fourth side 137 of the silver layer 130 on the lead-out portion T11 can have sidewalls 134 that are aligned, and there is no need to reserve overlapping tolerance for an overlapping structure between the silver layer 130 and the lead-out portion T11, which is beneficial to meet the narrow bezel requirement of the touch sensor 100.

As a supplementary note, differences between the one mask etching process of the present disclosure and a laser process are provided. The laser process is, for example, to emit a laser beam from a direction perpendicular to the main surface 111 of the substrate 110, in which the laser beam scans and etches linearly along the first direction D1 or the second direction D2. Therefore, the laser process may not be able to etch and trim the edge roughness SE2 on the second side 133 of the silver layer 130. For example, if the laser beam is aligned with the most convex portion of the edge roughness SE2 for trimming, the laser beam may damage the substrate 110 because there is no silver layer 130 to be etched at a relatively concave portion of the edge roughness SE2. Therefore, if the laser process is performed for patterning, the edge roughness SE2 on the second side 133 of the silver layer 130 is unable to be trimmed, thereby leaving a relatively large width $W_{SE2}$ of the edge roughness SE2 (e.g., greater than or equal to 10 pm and less than or equal to 50 μm) left by the screen-printing process.

In addition, also due to the one mask etching process performed in the present disclosure, a line width W1 of each of the peripheral traces PT arranged in parallel corresponding to the peripheral area PA can be controlled to be greater than or equal to 6 μm and less than or equal to 10 μm, and the line spacing D of two adjacent peripheral traces PT can be controlled to be greater than or equal to 6 μm and less than or equal to 10 μm. A person having ordinary skills in the art can understand that the line width W1 and the line spacing D are referred to as the line width W1 and the line spacing D of the peripheral traces PT located on the same side of the touch sensor 100 and extending in parallel along the same direction (e.g., the second direction D2). The line width W1 and the line spacing D of the peripheral trace PT with a double-layer structure of the present disclosure can be controlled to be within a specific range, which has a certain influence on the size of the peripheral area PA (e.g., the width W of the peripheral area PA) of the touch sensor 100, and since the size of the peripheral area PA further affects the bezel size of the terminal product, the touch sensor 100 of the present disclosure can meet the requirements of the electrical specifications as well as the demand for narrow bezel products. In some embodiments, when the second wiring T2 is designed to provide the function of the ground line GT, in order to increase the shielding effect (anti-static and anti-electromagnetic wave interferences) of the ground line GT, the line width W1 of the ground wire GT can be adjusted to be larger than the line width W1 of the signal line ST as deemed necessary. However, such an adjustment does not prevent the peripheral area PA of the touch sensor 100 of the present disclosure from meeting the requirements of narrow bezel products.

In some embodiments, the touch sensor 100 may further include a protective layer 140 disposed on the main surface 111 of the substrate 110 and entirely covering the metal nanowire layer 120 and the silver layer 130. The protective layer 140 may include insulating resins, organic materials, or inorganic materials. For example, the protective layer 140 may include materials such as polyethylene, polypropylene, polycarbonate, polyvinyl butyral, polystyrene sulfonic acid, acrylonitrile-butadiene-styrene copolymer, poly(3,4-ethylenedioxythiophene), ceramic, or combinations thereof.

Figure 3:
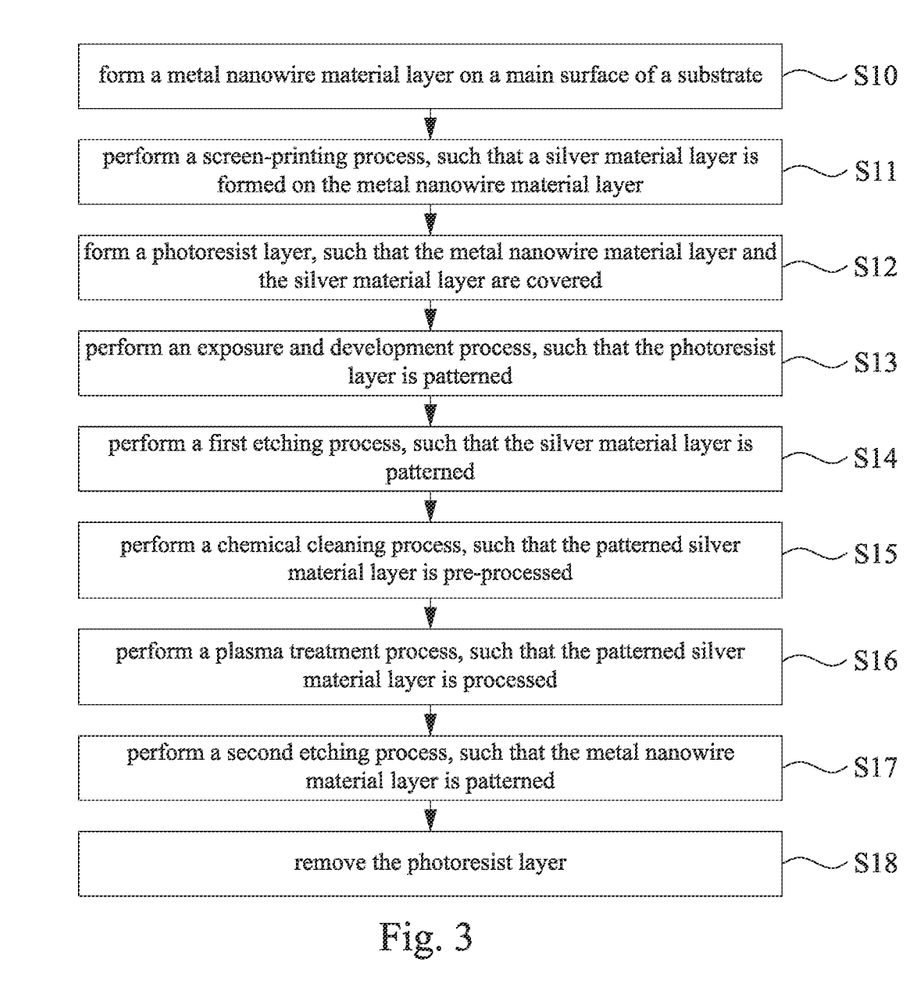
FIG. 3 is a flow chart illustrating a manufacturing method of a touch sensor according to some embodiments of the present disclosure.

It should be understood that the connection relationships and functions of the components which have been described will not be repeated hereinafter. Reference is made to FIG. 3, which illustrates a flow chart illustrating a manufacturing method of a touch sensor 100 according to some embodiments of the present disclosure. In the following description, the steps shown in FIG. 4A to FIG. 4I are taken as examples to describe the manufacturing method of a touch sensor 100, in which FIG. 4A to FIG. 4I are schematic cross-sectional views illustrating a manufacturing method of the touch sensor 100 of FIG. 1B in different steps. The manufacturing method of the touch sensor 100 includes steps S10 to S18, and the steps S10 to S18 may be performed in sequence.

Figure 4A:
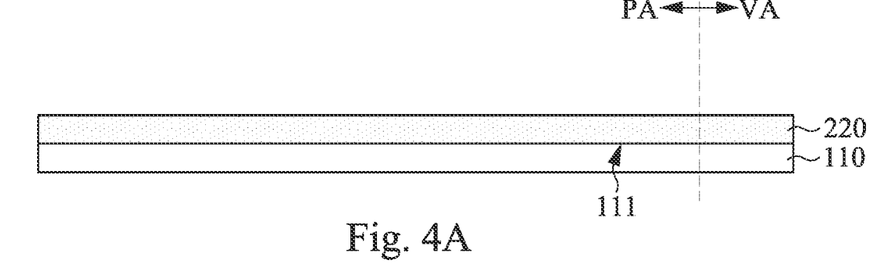
FIGS. 4A to FIG. 4I are schematic cross-sectional views illustrating a manufacturing method of the touch sensor of FIG. 1B in different steps.

Firstly, reference is made to FIG. 4A. In step S10, a metal nanowire material layer 220 is formed on a main surface 111 of a substrate 110, in which the metal nanowire material layer 220 corresponds to the visible area VA and the peripheral area PA. Specifically, a dispersion or slurry at least including metal nanowires and a matrix can be formed on the main surface 111 of the substrate 110 through processes such as screen printing, nozzle coating, or roller coating, and the dispersion or slurry is then cured or dried to form the metal nanowire material layer 220 disposed on the main surface 111 of the substrate 110. In some embodiments, a roll-to-roll process may be performed, such that the dispersion or slurry is coated on the main surface 111 of the substrate 110 supplied continuously. In some embodiments, pre-treatments may be performed on the main surface 111 of the substrate 110 before the metal nanowire material layer 220 is formed. For example, a surface modification process is performed or an adhesive layer or a resin layer is additionally coated on the main surface 111 of the substrate 110 to enhance the adhesion between the substrate 110 and other layers.

Figure 4B:
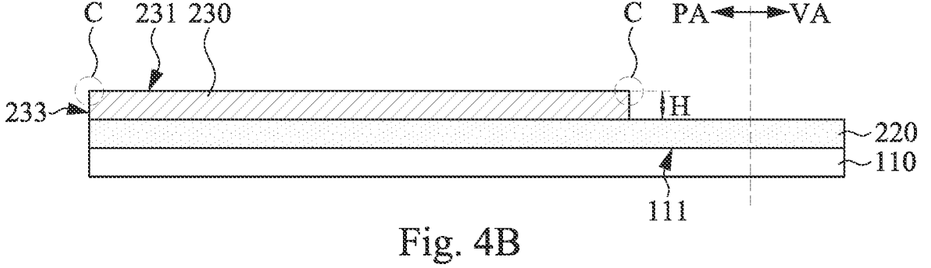

Then, reference is made to FIG. 4B. In step S11, a screen-printing process is performed to form a silver material layer 230 on the metal nanowire material layer 220, in which the silver material layer 230 corresponds to the peripheral area PA. Specifically, a silver paste material can be formed on the substrate 110 through a screen-printing process, in which the silver material layer 230 corresponds to the peripheral area PA to cover the metal nanowire material layer 220 corresponding to the peripheral area PA, and the silver paste material is then cured or dried to form the silver material layer 230. Since a screen has a plurality of mesh holes on its whole surface, and the screen commonly used is, for example, the screen with two angles of intersection, a non-linear edge including a sawtooth, concave portion, or convex portion will be formed on the edge of the entire layer that has undergone the screen-printing process due to the arrangement of the mesh holes of the screen. As a result, the formed silver material layer 230 may have an edge roughness at its edge (the edge herein refers to the turning point C between the upper surface 231 and the sidewall 233 of the silver material layer 230). As seen in FIG. 4B, the edge roughness is formed on the edge of the entire silver material layer 230 that faces toward the visible area VA, and the edge roughness is also formed on the edge of the entire silver material layer 230 that faces away from the visible area VA and adjacent to an edge of the main surface 111 of the substrate 110. A person having ordinary skill in the art can understand that the factors affecting the size (e.g., the width) of the edge roughness formed by screen printing may include, for example, parameters such as screen mesh count, distance between the screen and the squeegee, squeegee pressure of screen printing, squeegee speed of screen printing, distance between the screen and surface to be printed, leveling property of the silver paste material (the leveling property of the silver paste material can be affected by the viscosity of silver paste material), etc. In some embodiments, the screen mesh count is 640 meshes, the distance between the screen and the squeegee is 3 mm, the squeegee speed of screen printing is 50 m/min, the distance between the screen and surface to be printed is 2.5 mm, and the viscosity of the silver paste material is greater than or equal to 1000 cp and less than or equal to 5000 cp. In this regard, the width of the edge roughness of the silver material layer 230 formed by the screen-printing process of the present disclosure can be controlled within a range of greater than or equal to 10 μm and less than or equal to 50 μm.

Different types of the silver paste materials may further be used to form the silver material layer 230 in the present disclosure. Specifically, the silver paste material of first type may include solvent, an acrylic material (such as poly (methyl methacrylate)), and silver particles; the silver paste material of second type can generate silver elements through a silver mirror reaction which includes reaction between an aldehyde functional group (e.g., the aldehyde functional group of acetaldehyde) and a silver ammonia complex, in which the reaction formula is as follows:

In some embodiments, for the thickness H of the silver material layer 230 formed by a single screen-printing process, the silver material layer 230 formed using the silver paste material of first type may have a thickness H of about 1 μm to 1.5 μm, and the silver material layer 230 formed using the silver paste material of second type may have a thickness H ranging from 500 nm to 600 nm.

Figure 4C:
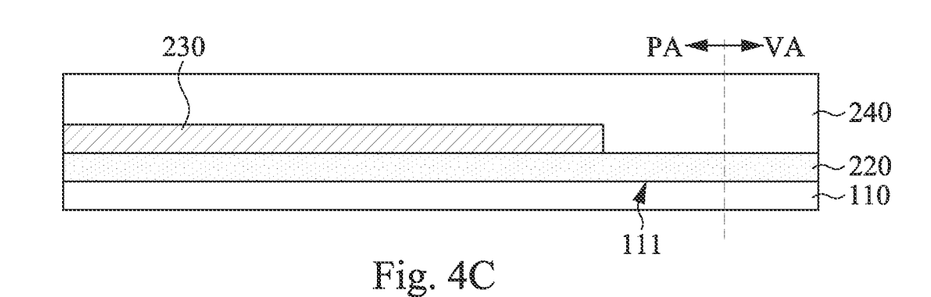
Figure 4D:
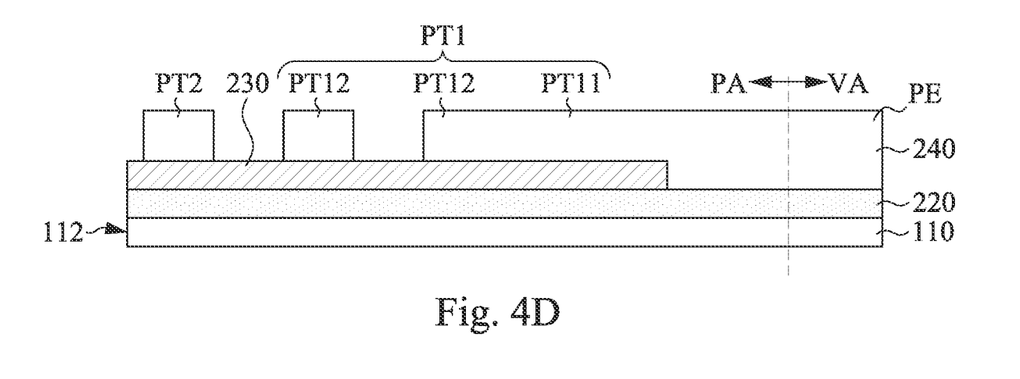

Next, reference is made to FIG. 4C. In step S12, a photoresist layer 240 is formed on the main surface 111 of the substrate 110 to entirely cover the metal nanowire material layer 220 and the silver material layer 230. Then, reference is made to FIG. 4D. In step S13, an exposure and development process is performed, such that the photoresist layer 240 is patterned. The desired patterns to be formed on the metal nanowire material layer 220 and the silver material layer 230 are formed at once on a single photoresist layer 240 through a single exposure and development process, so as to reduce the steps and costs of the manufacturing process. In some embodiments, the photoresist layer 240 defines an electrode portion pattern PE corresponding to the visible area VA and defines a first wiring pattern PT1 and a second wiring pattern PT2 corresponding to the peripheral area PA, in which the first wiring pattern PT1 is spaced apart and insulated from the second wiring pattern PT2. The first wiring pattern PT1 includes a lead-out portion pattern PT11 adjacent and connected to the electrode portion pattern PE and also includes a lead portion pattern PT12 connected to the lead portion pattern PT11, and the second wiring pattern PT2 is disposed on a side of the first wiring pattern PT1 relatively far away from the visible area VA and adjacent to an edge 112 of the main surface 111. The electrode portion pattern PE, the first wiring pattern PT1, and the second wiring pattern PT2 of the patterned photoresist layer 240 can be transferred to the metal nanowire material layer 220 and the silver material layer 230 in the subsequent etching process, so as to form the metal nanowire layer 120 including the electrode portion E, the first wiring T1, and the second wiring T2 as well as the silver layer 130 stacked on and in contact with the first wiring T1 and the second wiring T2 (for specific configuration, please refer to FIG. 1B) after the subsequent removal of the photoresist layer 240.

Subsequently, reference is made to FIG. 4E. In step S14, a first etching process is performed, such that the silver material layer 230 corresponding to the peripheral area PA is provided with a desired pattern. In detail, the silver material layer 230 can be patterned through the first wiring pattern PT1 and the second wiring pattern PT2 to be provided with a conformal pattern with the pattern of the lead portion pattern PT12 of the first wiring pattern PT1 and the pattern of the second wiring pattern PT2. It should be understood that, in the aforementioned step S13 (FIG. 4D), since the patterned photoresist layer 240 has a continuously covering surface between its electrode portion pattern PE and the lead-out portion pattern PT11 (i.e., the patterned photoresist layer 240 is continuously extending between its electrode portion pattern PE and its lead-out portion pattern PT11), the edge roughness formed on the silver material layer 230 facing toward the visible area VA and located in the non-etching region by the screen-printing process will be covered by the photoresist layer 240 and will not be etched and trimmed during the first etching process, and hence a width of the edge roughness of the silver material layer 230 facing toward the visible area VA and located in the non-etching region can still be maintained in a range of greater than or equal to 10 μm and less than or equal to 50 μm. On the other hand, in the aforementioned step S13 (FIG. 4D), since the edge roughness formed on the silver material layer 230 facing away from the visible area VA and located in the non-etching region is not covered by the photoresist layer 240, the edge roughness on the silver material layer 230 facing away from the visible area VA can be etched and trimmed during the first etching process, and hence a width of the edge roughness of the silver material layer 230 facing away from the visible area VA can be reduced to a range of greater than or equal to 0.01 μm and less than or equal to 5 μm. In some embodiments, the main components of the etching solution for etching the silver material layer 230 may include, for example, nitric acid and ferric nitrate, which can selectively etch the silver material layer 230 without etching the metal nanowire material layer 220 under the silver material layer 230. In some embodiments, the etching depth of the silver material layer 230 can be adjusted by, for example, controlling the etching time.

Figure 4E:
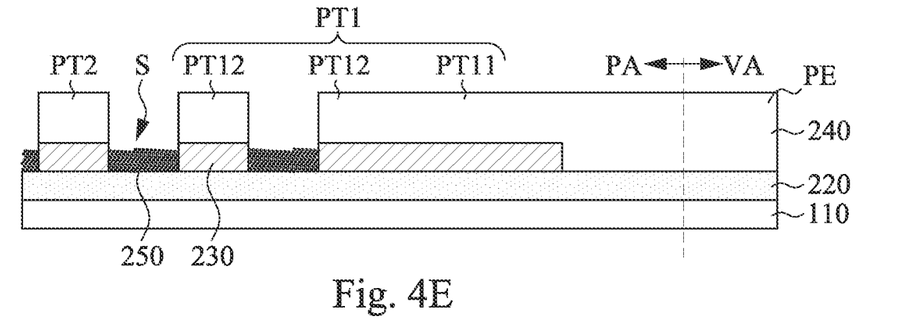

It is worth mentioning that, as shown in FIG. 4E, after the silver material layer 230 is etched, there is usually a residue 250, such as resin, remaining in the etching region S, and the residue 250 may affect the etching accuracy of the metal nanowire material layer 220 and further lead to difficulties of reducing the line width W1 and the line spacing D of the peripheral traces PT for meeting the requirements. In this regard, reference is made to FIG. 4F for step S15. In some embodiments, a chemical cleaning process is performed, such that the patterned silver material layer 230 is pre-processed through the first wiring pattern PT1 and the second wiring pattern PT2, or more specifically, the residue 250 in the etching region S is pre-processed. In some embodiments, during the chemical cleaning process, a surface treatment is performed using a chemical cleaning agent that can remove the resin on the silver material layer 230 for about 40 seconds at an ambient temperature of about 45° C. with a showerhead pressure of about 0.2 MPa, such that the residue 250 remaining in etching region S is removed.

Figure 4F:
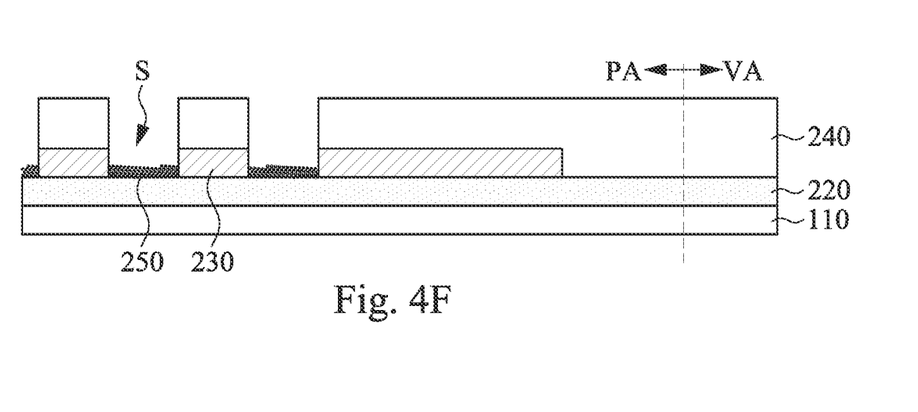

As shown in FIG. 4F, after the chemical cleaning process, the residue 250 in the etching region S can almost be removed. However, since the chemical cleaning process removes the residue 250 through chemical reaction, the residue 250 cannot be removed after the chemical equilibrium is reached, and hence there may be some cases in which the residue 250 in the etching region S cannot be completely removed. For example, when the silver paste material of first type is used to form the silver material layer 230 in step S11, the thickness of the residue 250 remaining in the etching region S may be about 300 nm after the first etching process in step S14 (FIG. 4E) is performed on the silver material layer 230 having a thickness of about 1.5 µm, and after the chemical cleaning process in step S15 (FIG. 4F) is performed, the thickness of the residue 250 remaining in the etching region S may be reduced to about 50 nm.

Figure 4G:
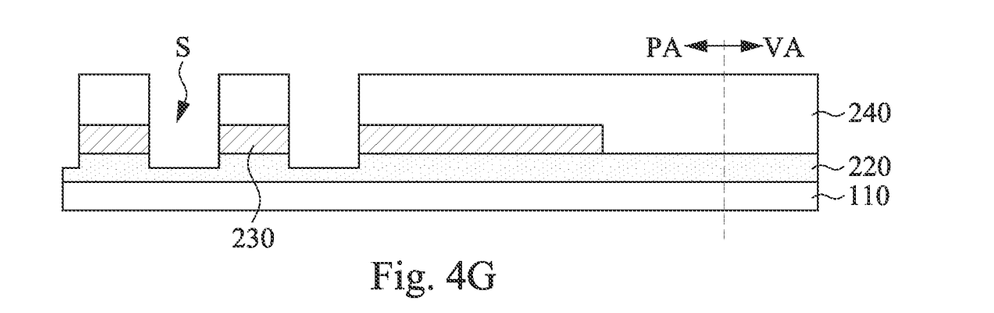

Furthermore, if there is a need to remove the residue 250 more completely to further improve the etching accuracy of the metal nanowire material layer 220, reference is made to FIG. 4G for step S16. In some embodiments, a plasma treatment process is performed, such that the patterned silver material layer 230 is further processed through the first wiring pattern PT1 and the second wiring pattern PT2, or more specifically, the residue 250 in the etching region S is processed. Since the plasma treatment is non-selective, all surfaces exposed to the treatment environment will be physically removed, such that the residue 250 can be completely removed. In some embodiments, the plasma treatment is performed on the silver material layer 230 for about 4.5 minutes, in which the plasma treatment is carried out by an argon plasma with a minimum vacuum degree of about 20 mttor, a working vacuum degree of about 200 mttor, a power of about 8kW, a helium flow rate of 1000 sccm (standard cubic centimeter per minute), and an oxygen flow rate of 1000 sccm to the silver material layer 230 for about 4.5 minutes. In some embodiments, the plasma treatment process can further remove the matrix in the upper layer of the metal nanowire material layer 220, so as to facilitate the subsequent second etching process.

As a supplementary note, the chemical cleaning process of step S15 and the plasma treatment process of step S16 can be selectively performed or adjusted according to the actual requirements of etching accuracy.

Figure 4H:
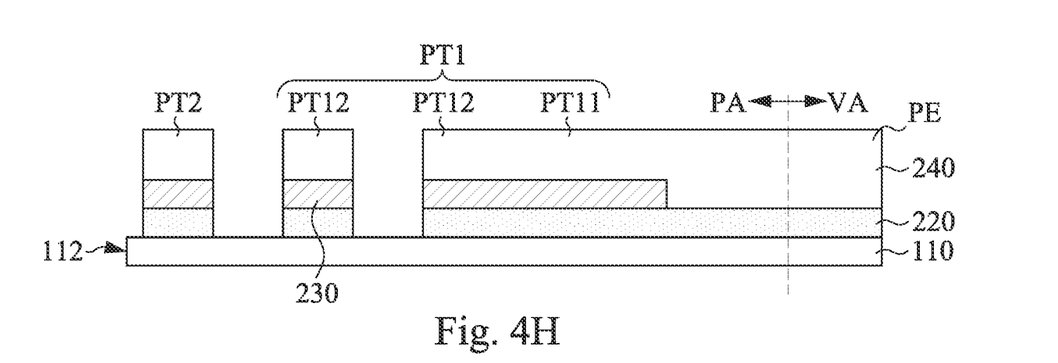

Next, reference is made to FIG. 4H. In step S17, a second etching process is performed, such that the metal nanowire material layer 220 corresponding to the peripheral area PA and the visible area VA is patterned. In detail, since the photoresist used in the second etching process and the photoresist used in the first etching process are the same photoresist layer 240, the pattern formed by the second etching process on the metal nanowire material layer 220 corresponding to the peripheral area PA will be the same as the pattern of the patterned silver material layer 230 corresponding to the peripheral area PA, and other expected patterns (e.g., the electrode portion pattern PE) are formed by the second etching process on the metal nanowire material layer 220 corresponding to the visible area VA. Overall, the electrode portion pattern PE, the first wiring pattern PT1, and the second wiring pattern PT2 of the photoresist layer 240 may be transferred to the metal nanowire material layer 220 during the second etching process, such that the metal nanowire material layer 220 is patterned to be provided with an electrode portion E corresponding to the visible area VA, a first wiring T1 corresponding to the peripheral area PA, and a second wiring T2 corresponding to the peripheral area PA and insulated from the first wiring T1, in which the first wiring T1 includes a lead-out portion T11 adjacent to the electrode portion E and a lead portion T12 connected to the lead-out portion T11, and the second wiring T2 is disposed on a side of the first wiring T1 relatively far away from the visible area VA and adjacent and in parallel to the edge 112 of the main surface 111 of the substrate 110 (please refer to FIG. 1B for the specific positions of the electrode portion E, the first wiring T1, and the second wiring T2). In some embodiments, the main components of the etching solution for etching the metal nanowire material layer 220 may include, for example, ferric chloride and hydrochloric acid. In some embodiments, the etching depth of the metal nanowire material layer 220 can be adjusted by, for example, controlling the etching time.

Figure 4I:
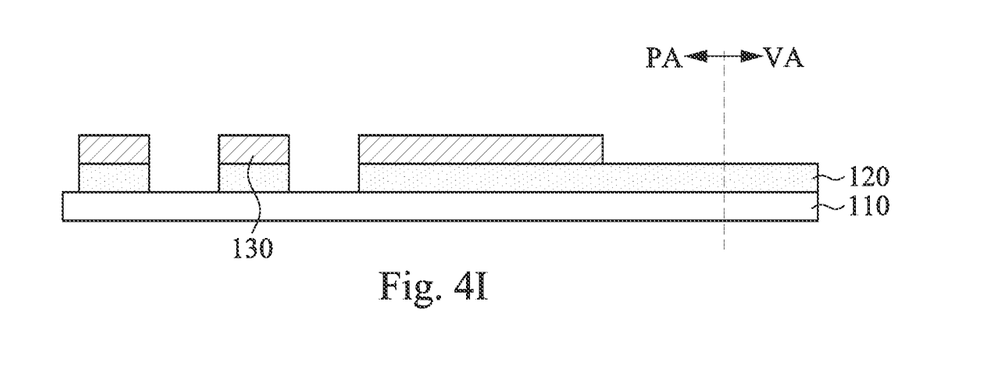

Reference is made to FIG. 4I and FIG. 10. In step S18, the photoresist layer 240 is removed. For the silver material layer 230, in detail, after the photoresist layer 240 is removed, the silver layer 130 formed by the patterned silver material layer 230 can be seen, in which the silver layer 130 has a first side 131 facing toward the visible area VA and a second side 133 facing away from the visible area VA. Through the arrangement of the photoresist layer 240 and the design of the first etching process, the first side 131 and the second side 133 of the silver layer 130 respectively have edge roughness SE1 and edge roughness SE2, and the width $W_{SE1}$ of the edge roughness SE1 on the first side 131 is greater than the width $W_{SE2}$ of the edge roughness SE2 on the second side 133.

For the metal nanowire material layer 220, after the photoresist layer 240 is removed, the metal nanowire layer 120 formed by the patterned metal nanowire material layer 220 can be seen, in which the electrode portion E of the metal nanowire layer 120 can at least constitute the touch electrode ET of the touch sensor 100, and the first wiring T1 and the second wiring T2 of the metal nanowire layer 120 as well as the silver layer 130 stacked on and in contact with the first wiring T1 and the second wiring T2 can at least constitute the peripheral trace PT of the touch sensor 100.

To sum up the above steps S13 to S18, the chemical cleaning process and the plasma treatment process can be selectively performed between the steps of the two etching processes (i.e., the first etching process and the second etching process) to improve the etching accuracy. The overall process is referred to as "development," "first etching (of the silver material layer 230)," "chemical cleaning," "plasma treatment," "second etching (of the metal nanowire material layer 220)," and "stripping," which is further shortened as "DECEPS process."

According to the aforementioned embodiments of the present disclosure, the touch sensor of the present disclosure is designed to include the metal nanowire layer which includes the electrode portion, the first wiring, and the second wiring as well as the silver layer stacked on and in contact with the first wiring and the second wiring. Since the size (e.g., the width) of the edge roughness on the side of the silver layer disposed on the second wiring and being far away from the visible area is smaller than the size of the edge roughness on the side of the silver layer disposed on the first wiring and facing toward the visible area, the outermost peripheral trace (e.g., the ground line) of the touch sensor can be provided with a smoother edge (i.e., a negligible edge roughness), which is beneficial to meet the narrow bezel requirement of the touch sensor. In addition, by integrally forming the electrode portion and the first wiring to directly form an electrical connection between the touch electrode and the peripheral trace, there is no need to design an additional overlapping structure for the touch sensor. Hence, an area occupied by the overlapping structure corresponding to the peripheral area can be saved, and the overlapping tolerance will not be generated, which is beneficial to realize the narrow bezel design of the touch sensor. Furthermore, based on the stacked-structure design of the touch sensor of the present disclosure, during the manufacturing process of the touch sensor, the patterned photoresist layer is designed to be continuously extending between its electrode portion pattern and its lead-out portion pattern, such that the touch electrode and the peripheral trace can be formed at once through a single exposure and development process (i.e., only a single photoresist layer is used), thereby reducing the steps and costs of the manufacturing process.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A touch sensor having a visible area and a peripheral area adjacent to at least one side of the visible area, the touch sensor comprising:
    a substrate;
    a metal nanowire layer disposed on a main surface of the substrate, wherein the metal nanowire layer defines an electrode portion corresponding to the visible area, defines a plurality of first wirings disposed at intervals corresponding to the peripheral area, and defines a second wiring corresponding to the peripheral area, the second wiring is spaced apart from the first wirings, the first wirings each comprise a lead-out portion and a lead portion, the lead-out portion is adjacent and connected to the electrode portion, the lead portion is connected to the lead-out portion, and the second wiring is disposed on a side of the first wirings relatively far away from the visible area and adjacent to an edge of the main surface; and
    a silver layer stacked on and in contact with the first wirings and the second wiring, wherein the silver layer is disposed on and in contact with an upper surface of the first wirings to form a plurality of peripheral traces of the touch sensor, the silver layer has a first side facing toward the visible area on the lead-out portion and a second side facing away from the visible area on the second wiring, an edge roughness on the first side of the silver layer is greater than an edge roughness on the second side of the silver layer, a line width of the peripheral traces is greater than or equal to 6 µm and less than or equal to 10 µm, and a line spacing of any adjacent two peripheral traces of the peripheral traces is greater than or equal to 6 µm and less than or equal to 10 µm.

2. The touch sensor of claim 1, wherein a width of the edge roughness on the first side of the silver layer is greater than or equal to 10 µm and less than or equal to 50 µm, and a width of the edge roughness on the second side of the silver layer is greater than or equal to 0.01 µm and less than or equal to 5 µm.

3. The touch sensor of claim 1, wherein the silver layer has a third side facing away from the visible area on the lead-out portion and two fourth sides interconnecting the first side and the third side, and the lead-out portion, the third side of the silver layer, and the two fourth sides of the silver layer have sidewalls that are aligned.

4. The touch sensor of claim 1, wherein the lead portion and the silver layer stacked on and in contact with the lead portion have sidewalls that are aligned.

5. The touch sensor of claim 1, wherein the silver layer has a fifth side facing toward the visible area on the second wiring, and the second wiring and the fifth side of the silver layer have sidewalls that are aligned.

6. A manufacturing method of a touch sensor having a visible area and a peripheral area adjacent to at least one side of the visible area, the manufacturing method comprising:
    forming a metal nanowire material layer on a main surface of a substrate, wherein the metal nanowire material layer corresponds to the visible area and the peripheral area;
    performing a screen-printing process, such that a silver material layer is formed on the metal nanowire material layer and corresponds to the peripheral area;
    forming a photoresist layer to cover the metal nanowire material layer and the silver material layer;
    performing an exposure and development process to pattern the photoresist layer, wherein the photoresist layer, which is patterned, defines an electrode portion pattern corresponding to the visible area, defines a plurality of first wiring patterns disposed at intervals corresponding to the peripheral area and defines a second wiring pattern corresponding to the peripheral area, the second wiring pattern is spaced apart from the first wiring patterns, the first wiring patterns each comprise a lead-out portion pattern and a lead portion pattern, the lead-out portion pattern is adjacent and connected to the electrode portion pattern, the lead portion pattern is connected to the lead-out portion pattern, the second wiring pattern is disposed on a side of the first wiring patterns relatively far away from the visible area and adjacent to an edge of the main surface, and the electrode portion pattern and the lead-out portion pattern of the photoresist layer, which is patterned, is a continuously covering layer;
    performing a first etching process to pattern the silver material layer through the first wiring pattern and the second wiring pattern to form a silver layer;
    performing a second etching process to pattern the metal nanowire material layer through the first wiring pattern and the second wiring pattern to form a plurality of first wirings and a second wiring, wherein the first wirings each comprise a lead-out portion corresponding to the lead-out portion pattern and a lead portion corresponding to the lead portion pattern, the silver layer is disposed on and in contact with an upper surface of the first wirings to form a plurality of peripheral traces of the touch sensor, the silver layer has a first side facing toward the visible area on the lead-out portion and a second side facing away from the visible area on the second wiring, an edge roughness on the first side of the silver layer is greater than an edge roughness on the second side of the silver layer, a line width of the peripheral traces is greater than or equal to 6 µm and less than or equal to 10 µm, and a line spacing of any adjacent two peripheral traces of the peripheral traces is greater than or equal to 6 µm and less than or equal to 10 µm; and
    removing the photoresist layer.

7. The manufacturing method of the touch sensor of claim 6, further comprising:
    performing a plasma treatment process after the first etching process and before the second etching process, such that the silver layer is processed through the first wiring pattern and the second wiring pattern.

8. The manufacturing method of the touch sensor of claim 7, further comprising:

performing a chemical cleaning process after the first etching process and before the plasma treatment process, such that the silver layer is pre-processed through the first wiring pattern and the second wiring pattern.

9. A touch sensor having a visible area and a peripheral area adjacent to at least one side of the visible area, the touch sensor comprising:
a substrate;
a metal nanowire layer disposed on a main surface of the substrate, wherein the metal nanowire layer defines an electrode portion corresponding to the visible area and defines a first wiring and a second wiring corresponding to the peripheral area, the second wiring is spaced apart from the first wiring, the first wiring comprises a lead-out portion and a lead portion, the lead-out portion is adjacent and connected to the electrode portion, the lead portion is connected to the lead-out portion, and the second wiring is disposed on a side of the first wiring relatively far away from the visible area and adjacent to an edge of the main surface; and
a silver layer stacked on and in contact with the first wiring and the second wiring, wherein the silver layer has a bottom surface, a top surface, and a first side surface between the bottom surface and the top surface, and a width of an edge roughness of the first side surface of the silver layer is greater than or equal to 10 μm and less than or equal to 50 μm.

10. The touch sensor of claim 9, wherein the silver layer has a second side surface between the bottom surface and the top surface, and a width of an edge roughness on the second side surface is greater than or equal to 0.01 μm and less than or equal to 5 μm.

11. The touch sensor of claim 10, wherein the first side surface overlies the first wiring and the second side surface overlies the second wiring.

12. The touch sensor of claim 9, wherein the first side surface overlies the first wiring.

13. The touch sensor of claim 9, wherein the silver layer has a second side surface co-planar with a side surface of the lead portion.

14. The touch sensor of claim 13, wherein the silver layer has a third side surface between the bottom surface and the top surface, a width of an edge roughness on the third side surface is greater than or equal to 0.01 μm and less than or equal to 5 μm, and the second side surface is between the first side surface and the third side surface.

15. The touch sensor of claim 9, wherein the first side surface overlies the lead-out portion.

16. The touch sensor of claim 9, wherein the metal nanowire layer defines a plurality of the first wirings disposed at intervals corresponding to the peripheral area, and the silver layer is disposed on and in contact with an upper surface of the first wirings to form a plurality of peripheral traces of the touch sensor.

17. The touch sensor of claim 16, wherein a line width of the peripheral traces is greater than or equal to 6 μm and less than or equal to 10 μm.

18. The touch sensor of claim 17, wherein a line spacing of any adjacent two peripheral traces of the peripheral traces is greater than or equal to 6 μm and less than or equal to 10 μm.

* * * * *